(12) United States Patent
Mitrovic et al.

(10) Patent No.: US 9,595,653 B2
(45) Date of Patent: Mar. 14, 2017

(54) PHONONIC STRUCTURES AND RELATED DEVICES AND METHODS

(71) Applicant: CALIFORNIA INSTITUTE OF TECHNOLOGY, Pasadena, CA (US)

(72) Inventors: Slobodan Mitrovic, Pasadena, CA (US); Jen-Kan Yu, Pasadena, CA (US); James R. Heath, South Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 634 days.

(21) Appl. No.: 13/853,987

(22) Filed: Mar. 29, 2013

(65) Prior Publication Data

US 2013/0255738 A1 Oct. 3, 2013

Related U.S. Application Data

(60) Provisional application No. 61/617,546, filed on Mar. 29, 2012.

(51) Int. Cl.
*H01L 35/26* (2006.01)
*H01L 21/22* (2006.01)

(52) U.S. Cl.
CPC ............. *H01L 35/26* (2013.01); *H01L 21/22* (2013.01); *Y10T 428/24273* (2015.01); *Y10T 428/24802* (2015.01)

(58) Field of Classification Search
CPC ................................ H01L 35/26; H01L 35/32
USPC ...................... 136/206, 236.1, 224
See application file for complete search history.

(56) References Cited

U.S. PATENT DOCUMENTS

| | | |
|---|---|---|
| 3,653,989 A | 4/1972 | Widmer |
| 4,078,945 A | 3/1978 | Gonsiorawski |
| 4,092,445 A | 5/1978 | Tsuzuki et al. |
| 4,681,657 A | 7/1987 | Hwang et al. |
| 5,089,293 A | 2/1992 | Bohara et al. |
| 5,139,624 A | 8/1992 | Searson et al. |
| 5,206,523 A | 4/1993 | Goesele et al. |
| 5,415,699 A | 5/1995 | Harman |
| 5,552,328 A | 9/1996 | Orlowski et al. |
| 5,565,084 A | 10/1996 | Lee et al. |
| 5,695,557 A | 12/1997 | Yamagata et al. |
| 5,767,020 A | 6/1998 | Sakaguchi et al. |

(Continued)

FOREIGN PATENT DOCUMENTS

| | | |
|---|---|---|
| JP | 2004193526 A | 7/2004 |
| JP | 2006-140334 A | 6/2006 |

(Continued)

OTHER PUBLICATIONS

Yu, J.-K. et al., Reduction of thermal conductivity in phononic nanomesh structures, *Nature Nanotechnology*, Oct. 2010, vol. 5, pp. 718-721.

(Continued)

*Primary Examiner* — Susan D Leong
(74) *Attorney, Agent, or Firm* — Steinfl + Bruno LLP

(57) ABSTRACT

Phononic structures, devices related to phononic structures, and methods related to fabrication of the phononic structures are described. The phononic structure can include a sheet of material, where the sheet of material can include a plurality of regions. Adjacent regions in the sheet of material can have dissimilar phononic patterns.

11 Claims, 8 Drawing Sheets

(56) References Cited

U.S. PATENT DOCUMENTS

| | | |
|---|---|---|
| 5,868,947 A | 2/1999 | Sakaguchi et al. |
| 5,873,003 A | 2/1999 | Inoue et al. |
| 5,895,223 A | 4/1999 | Peng et al. |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,313,015 B1 | 11/2001 | Lee et al. |
| 6,452,206 B1 | 9/2002 | Harman et al. |
| 6,762,134 B2 | 7/2004 | Bohn et al. |
| 6,790,785 B1 | 9/2004 | Li et al. |
| 6,803,260 B2 | 10/2004 | Shin et al. |
| 6,882,051 B2 | 4/2005 | Majumdar et al. |
| 7,115,971 B2 | 10/2006 | Stumbo et al. |
| 7,135,728 B2 | 11/2006 | Duan et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,569,941 B2 | 8/2009 | Majumdar et al. |
| 7,572,669 B2 | 8/2009 | Tuominen et al. |
| 7,629,531 B2 | 12/2009 | Stark |
| 7,675,084 B2 | 3/2010 | Wierer, Jr. et al. |
| 7,960,258 B2 | 6/2011 | Chao et al. |
| 8,087,254 B2 | 1/2012 | Arnold |
| 8,094,023 B1 | 1/2012 | El-Kady et al. |
| 8,101,449 B2 | 1/2012 | Liang et al. |
| 8,278,191 B2 | 10/2012 | Hildreth et al. |
| 8,486,843 B2 | 7/2013 | Li et al. |
| 8,641,912 B2 | 2/2014 | Heath et al. |
| 9,065,016 B2 | 6/2015 | Peter et al. |
| 9,209,375 B2 | 12/2015 | Boukai et al. |
| 9,263,662 B2 | 2/2016 | Boukai et al. |
| 2003/0099279 A1 | 5/2003 | Venkatasubramanian et al. |
| 2004/0152240 A1 | 8/2004 | Dangelo |
| 2005/0133254 A1 | 6/2005 | Tsakalakos |
| 2005/0150535 A1* | 7/2005 | Samavedam ........... H01L 23/38 136/201 |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0028956 A1 | 2/2007 | Venkatasubramanian et al. |
| 2007/0277866 A1 | 12/2007 | Sander et al. |
| 2008/0019876 A1 | 1/2008 | Chau et al. |
| 2008/0173344 A1 | 7/2008 | Zhang et al. |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0117741 A1 | 5/2009 | Heath et al. |
| 2009/0295505 A1 | 12/2009 | Mohammadi et al. |
| 2010/0035163 A1 | 2/2010 | Kobrin |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0212328 A1* | 8/2010 | Murai ........... B22F 1/025 62/3.2 |
| 2010/0248449 A1 | 9/2010 | Hildreth et al. |
| 2011/0114145 A1 | 5/2011 | Yang et al. |
| 2011/0114146 A1 | 5/2011 | Scullin et al. |
| 2011/0168978 A1 | 7/2011 | Kochergin |
| 2011/0215441 A1 | 9/2011 | Lin et al. |
| 2011/0263119 A1 | 10/2011 | Li et al. |
| 2011/0266521 A1 | 11/2011 | Ferrari et al. |
| 2012/0097204 A1 | 4/2012 | Yu et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0216848 A1 | 8/2012 | Gray et al. |
| 2012/0217165 A1 | 8/2012 | Feng et al. |
| 2012/0227663 A1 | 9/2012 | Jha et al. |
| 2012/0282435 A1 | 11/2012 | Yang et al. |
| 2012/0295074 A1 | 11/2012 | Yi et al. |
| 2012/0298928 A1 | 11/2012 | Rowe et al. |
| 2012/0319082 A1 | 12/2012 | Yi et al. |
| 2012/0326097 A1 | 12/2012 | Ren et al. |
| 2013/0019918 A1 | 1/2013 | Boukai et al. |
| 2013/0052762 A1 | 2/2013 | Li et al. |
| 2013/0087180 A1 | 4/2013 | Stark et al. |
| 2013/0175484 A1 | 7/2013 | Ren et al. |
| 2013/0186445 A1 | 7/2013 | Lorimer et al. |
| 2014/0326287 A1 | 11/2014 | Wiant et al. |
| 2014/0373888 A1 | 12/2014 | Boukai et al. |
| 2015/0101788 A1 | 4/2015 | Smith et al. |
| 2015/0162517 A1 | 6/2015 | Kasichainula |
| 2015/0228883 A1 | 8/2015 | Boukai et al. |
| 2015/0280099 A1 | 10/2015 | Boukai et al. |
| 2015/0325772 A1 | 11/2015 | Boukai et al. |

FOREIGN PATENT DOCUMENTS

| | | |
|---|---|---|
| KR | 10-2011-0102693 A | 9/2011 |
| WO | 02/23607 A1 | 3/2002 |
| WO | 2010003629 A2 | 1/2010 |
| WO | 2011049804 A2 | 4/2011 |
| WO | 2012068426 A2 | 5/2012 |
| WO | 2013012842 A1 | 1/2013 |
| WO | 2013109729 A1 | 7/2013 |
| WO | 2014028903 A1 | 2/2014 |
| WO | 2014070795 A1 | 5/2014 |
| WO | 2014179622 A1 | 11/2014 |
| WO | 2015134394 A1 | 9/2015 |

OTHER PUBLICATIONS

Yu, J.-K. et al., Thermal conductivity in phononic nanomesh structures, *Nature Nanotechnology*, Oct. 2010, vol. 5, pp. 1-14.

Hopkins, P. E. et al. Reduction in the Thermal Conductivity of Single Crystalline Silicon by Phononic Crystal Patterning. *Nano Letters* 2011, 11, pp. 107-112.

Zhang, P. P. et al. Electronic transport in nanometre-scale silicon-on-insulator membranes. *Nature Letters*, Feb. 2006, vol. 439, pp. 703-706.

Written Opinion for International Application No. PCT/US2013/034710 filed Mar. 29, 2013 on behalf of California Institute of Technology. Mail date: Aug. 12, 2013.

International Search Report for International Application No. PCT/US2013/034710 filed Mar. 29, 2013 on behalf of California Institute of Technology. Mail date: Aug. 12, 2013.

International Search Report issued for PCT Application No. PCT/US2011/057171 filed on Oct. 20, 2011 in the name of California Insitute of Technology et al. mail date: May 29, 2012.

Written Opinion issued for PCT Application No. PCT/US2011/057171 filed on Oct. 20, 2011 in the name of California Insitute of Technology et al. mail date: May 29, 2012.

Restriction Requirement issued for U.S Appl. No. 13/278,074, filed Oct. 20, 2011 in the name of Jen-Kan Yu et al. mail date: Jan. 14, 2013.

Non-Final Office Action issued for U.S Appl. No. 13/278,074, filed Oct. 20, 2011 in the name of Jen-Kan Yu et al. mail date: Apr. 25, 2013.

Final Office Action issued for U.S Appl. No. 13/278,074, filed Oct. 20, 2011 in the name of Jen-Kan Yu et al. mail date: Aug. 7, 2013.

Hochblau, et al. *Enhanced thermoelectric performance of rough silicon nanowires*. Nature Publishing Group, Jan. 2008, vol. 451, pp. 1-6.

Lee, et al. *Nanoporous Si as an Efficient Thermoelectric Material*, American Chemical Society, 2008, vol. 8, pp. 1-5.

Boukai, et al. *Silicon nanowires as efficient thermoelectric materials*. Nature Publishing Group, Jan. 2008, vol. 451, pp. 1-4.

Snyder, G.J. et al. Complex thermoelectric materials. Nature Mater., 2008, vol. 7, pp. 105-114.

(56) References Cited

OTHER PUBLICATIONS

Majumdar, A. *Thermoelectricity in semiconductor nanostructures.* Science., Feb. 2004, vol. 303 (5659), pp. 777-778.
Mahajan, R. et al. *Cooling a Microprocessor Chip.* Proc:. IEEE. 2006, vol. 94, pp. 1476-1486.
Cahill, D.G. et al. Lower limit to the thermal conductivity of disorderm crystals. *Phys. Rev. B*, 1992,vol. 46, pp. 6131-6140.
Dames, C. & Chen, G. In Thermoelectrics Handbook: Macro to Nano (ed. Rowe, D.M.) (CRC Press, 2006), Chapter 22.
Harman, T. C. et al. Quantum dot superlattice thermoelectric materials and devices. *Science*, Sep. 27, 2002, vol. 297, pp. 2229-2232.
Poudel, B. et al High-thermoelectric performance of nanostructured bismuth antimony telluride bulk alloys. *Science*, 2008, vol. 320, pp. 634-638.
Hsu, K. P. et al. Cubic $A_gPb_mSbTe_{2+m}$: bulk thermoelectric materials with high figure of merit. Science, 2004. vol. 303, pp. 818-821.
Balandin, A. et al. Significant decrease of the lattice thermal conductivity due to phonon confinement in a free-standing semiconductor quantum well. Phys. Rev. B., 1998, vol. 58, pp. 1544-1549.
Boukai, A. et al. Silicon nanowires as efficient thermoelectric materials. Nature, 2008, vol. 451, pp. 168-171.
Li. D.Y. et al. Thermal conductivity of individual silicon nanowires. Appl. Phys. Lett., 2003, vol. 83, pp. 2934-2936.
Hochbaum, A.I. et al. Enhanced thermoelectric performance of rough silicon nanowires. Nature, 2008, vol. 451, pp. 163-167.
Venkatasubramanuan, R. et al. Thin-film thermoelectric devices with high room-temperature figures of merit. Nature, 2001, vol. 413, pp. 597-602.
Li, D.Y. et al. Thermal conductivity of Si/SiGe superlattice nanowires. Appl. Phys. Lett., 2003, vol. 83, pp. 3186-3188.
Yang, B. et al. Partially coherent phonon heat conduction in superlattices. Phys Rev. B., 2003, vol. 67, 195311.
Wang, D. W. et al. Silicon p-FETs from ultrahigh density nanowire arrays. Nano Lett., 2006, vol. 6, pp. 1096-1100.
Shi, L. et al. Measuring thermal and thermoelectric properties of one-dimensional nanostructures using a microfabricated device. J. Heat Transfer, 2003, vol. 125, pp. 881-888.
Lui, W.J. et al. Thermal conduction in ultrathin pure and doped single-crystal silicon layers at high temperatures. J. Appl. Phys., 2005, vol. 98, 123523.
Bera, C. et al. Marked effects of alloying on the thermal conductivity of nanoporous materials. Phys. Rev. Lett., 2010, vol. 104, pp. 115502.
Simkin, M.V. et al. Minimum thermal conductivity of superlattices. Phys. Rev. Lett., 2000, vol. 84, pp. 927-930.
Hyldgaard, P. et al. Phonon superlattice transport. Phys. Rev. B., 1997, vol. 56, pp. 10754-10757.
Ren, S.Y. et al. Thermal-conductivity of super-lattices. Phys. Rev. B., 1982, vol. 25, pp. 3750-3755.
Tamura, S. et al. Phonon group velocity and thermal conduction in superlattices. Phys. Rev. B., 1990, vol. 60, pp. 2627-2630.
Gillet, J. N. et al. Atomic-scale three-dimensional phononic crystals with a very low thermal conductivity to design crystalline thermoelectric devices. J. Heat Transfer, 2009, vol. 131, 043206.
Lee, J. H. et al. Nanoporous Si as an efficient thermoelectric material. Nano Lett., 2008, vol. 8, pp. 3750-3754.
Lee, J.H. et al. Lattice thermal conductivity of nanoporous Si: molecular dynamics study. Appl. Phys Lett, 2007, vol. 91, 223110.
Donadio, D. et al. Temperature dependence of the thermal conductivity of thin silicon nanowires. Nano. Lett., 2010, vol. 10, pp. 847-851.
Chapman, P.W. et al. Electrical properties of heavily doped silicon. J. Appl. Phys., 1963, vol. 34, pp. 3291-3295.
37-Heath, J.R. Supperlattice nanowire pattern transfer (SNAP). Acc. Chem. Res., 2008, vol. 41, pp. 1609-1617.
Tracton, A.A. Coatings technology handbook. 62-1 (CRC Press, 2005).

Meng, E., et al. Plasma removal of Parylene C. Journal of Micromechanics and Microengineering, 2008, vol. 18, 045004-045504.
Agne et al. "Doping of the nanocrystalline semiconductor zinc oxide with the donor indium" Amer. Institute of Physics, vol. 83; No. 6; pp. 1204-1206; Aug. 11, 2003.
Beckman et al. "Bridging Dimensions: Demultiplexing Ultrahigh-Density nanowire Circuits" Science Oct. 21, 2005; 310; pp. 465-468.
Beckman et al. "Fabrication of Conducting Si nanowire Arrays" J. Appl. Phys. 2004; vol. 10; pp. 5921-5923.
Behnen "Quantitative examination of the thermoelectric power of n-type Si in the phonon drag regime" Journal of Applied Physics; Jan. 1, 1990; vol. 67; pp. 287-292.
Boukai "Thermoelectric properties of bismuth and silicon nanowires" Ph.D. Dissertation; California Institute of Technology; 2008.
Boukai et al. "Size-Dependent transport and thermoelectric properties of individual procrystalline bismuth nanowires" Advanced Materials; 2006; vol. 18; pp. 864-869.
Bunimovich et al. "Quantitative Real-Time Measurements of DNA Hybridization with Alkylated nonoxidized Silicon nanowires in Electrolyte Solution" JACS 2006; 128; pp. 16323-16331.
Chadwick et al. "Plane waves in an elastic solid conducting heat" Journal of the Mechanics and Physics of Solids; 1958; vol. 6; pp. 223-230.
Chen et al. "Dispenser Printed Microscale Thermoelectric Generators for Powering Wireless Sensor Networks" Paper No. IMECE2009-11636; 2009; pp. 343-352.
Chen et al. "Recent developments in thermoelectric materials" International Materials Reviews; vol. 48; 2003; pp. 45-66.
Choi et al. "Fabrication of bismuth nanowires with a silver nanocrystal shadowmask" J. Vac. Sci. Tech. A-Vac. Surf. And Films; 2000; vol. 18; pp. 1236-1328.
Choi et al. "Fabrication of nanometer size photoresis wire patterns with a silver nanocrystal shadowmask" J. Vac. Sci. & Tech. A- Vac. Surf. And Films; 1999; vol. 17; p. 1425-1427.
Chung et al. "Fabrication and Alignment of Wires in Two-Dimensions" The Journal of Physical Chemistry B.; 1998; vol. 102; No. 35; pp. 6685-6687.
Collier et al. "Nanocrystal superlattices" Annu. Rev. Phys. Chem. 1998; vol. 49; pp. 371-404.
Deresiewicz "Plane waves in a thermoelastic solid" Journal of the Acoustical Society of America; 1957; vol. 29; pp. 204-209.
Diehl et al. Self-Assembly of Deterministic Carbon nanotube wiring networks Angew. Chem. Int.; 2002; Ed. 41; p. 353-356.
Fan et al. "Self-Oriented Regular Arrays of Carbon nanotubes and their Field Emission Devices" Science; Jan. 22, 1999; vol. 283; p. 512-514.
Geballe et al. "Seebeck Effect in Silicon" Physical Review; May 15, 1955; vol. 98; pp. 940-947.
Green et al. "A 160-kilobit molecular electronic memory patterned at 1011 bits per square centimeter" Nature 2007; vol. 445; pp. 414-417.
Gurevich "Thermoelectric properties of conductors" Journal of Physics; vol. 9; No. 6; 1945; pp. 477-488.
Haynes et al. Nanosphere Lithography: A versatile nanofabrication Tool for Studies of Size-Dependent nanoparticle Optics J. Phys. Chem. B. ; 2001; vol. 105; pp. 5599-5611.
Heath et al. "A Defect-Tolerant Computer Architecture: Opportunities for nanotechnology" Science 1998; vol. 280; pp. 1716-1721.
Heath et al. "Pressure/Temperature Phase Diagrams and Superlattices of Organically Functionalized Metal nanocrystal Monolayers: The Influence of Particle Size, Size Distribution, and Surface Passivant" J. Phys. Chem. B. 1997; vol. 101; pp. 189-197.
Herring "Theory of the thermoelectric power of semiconductors" Physical Review; Dec. 1, 1954; vol. 96; No. 5; pp. 1163-1187.
Hicks et al. "Thermoelectric figure of merit of a one-dimensional conductor" Physical Review B. vol. 47; p. 6631-6634.
Huang et al. "Metal-assisted chemical etching of silicon: a review" Adv. Mater.; Jan. 11, 2011; vol. 23; No. 2; pp. 285-308.
Huang et al. "Spontaneous formation of nanoparticle stripe patterns through dewetting" Nature Materials; Dec. 2005; vol. 4; p. 896-900.

(56) References Cited

OTHER PUBLICATIONS

Hulteen et al. "Nanosphere lithography: A materials general fabrication process for periodic particle array surfaces" J. Vac. Sci. Technol. 1995; vol. 13; pp. 1553-1558.

Humphrey et al. "Reversible thermoelectric nanomaterials" Physical Review Letters; 2005; vol. 94, pp. 096601-1-096601-4.

Husain et al. "Nanowire-based very-high-frequency electromechanical resonator" Applied Physics Letters; vol. 83; No. 6; Aug. 11, 2003; pp. 1240-1242.

El-Kady et al. "Manipulation of thermal phonons: a phononic crystal route to high-ZT thermoelectrics." Photonic and Phononic Properties of Engineered nanostructures, SPIE. 1000 20th St. Bellingham WA 98225; Feb. 10, 2011; 7946: pp. 1-9.

Joannopoulos et al. "Photonic crystals: putting a new twist on light" Nature 1997; vol. 386; pp. 143-149.

Jung et al. "Circuit Fabrication at 17 nm Half-Pitch by nanoimprint Lithography" NanoLetters; 2006; vol. 6; p. 351-354.

Koga et al. "Experimental proof-of-principle investigation of enhanced Z3DT in (100) oriented Si/Ge superlattices" Applied Physics Letters; 2000; vol. 77; pp. 1490-1492.

Joshi et al. "Enhanced thermoelectric figure-of-merit in nanostructured p-type silicon germanium bulk alloys" Nano. Letters; 2008; vol. 8; No. 12; pp. 4670-5674.

Lee et al. "Nanostructured bulk thermoelectric materials and their properties" ICT 2005; 24th International Conference on Thermoelectrics (ICT); 2005; pp. 272-275.

Li et al. "Measuring thermal and thermoelectric properties of one-dimensional nanostructures using a microfabricated device" Journal of heat transfer; Oct. 2003; vol. 125; pp. 881-888.

Lifshitz et al. "Thermoelastic damping in micro- and nanomechanical systems" Physical Review B 61; 2000; pp. 5600-5609.

Llaguno et al. "Observation of thermopower oscillations in the coulomb blockade regime in a semiconducting carbon nanotube" Nano. Letters; 2004; vol. 4; pp. 45-49.

Mahan et al. "The best thermoelectric" PnAS 93; 1996; pp. 7436-7439.

Mahan et al. "Thermoelectric materials: new approaches to an old problem" Physics Today; Mar. 1997; vol. 50; pp. 42-47.

Maranganti et al. "Length scales at which classical elasticity breaks down for various materials" Physical Review Letters; 2007; vol. 98; pp. 195504-1-4.

Martin "Nanomaterials—A membrane based synthetic approach" Science; Dec. 23, 1994; vol. 266; pp. 1961-1966.

Melosh et al. "Ultra-high density nanowire lattices and circuits" Science; Apr. 4, 2003; vol. 300; pp. 112-115.

Morales et al. "A laser ablation method for the synthesis of semiconductor crystalline nanowires" Science; Jan. 9, 1998; vol. 279; pp. 208-211.

NDT Resource Center, Thermal Conductivity. Downloaded Nov. 26, 2013 from https://www.nde-ed.org/EducationResources/CommunityCollege/Materials/Physical_Chemical/ThermalConductivity.htm.

Pearson "Survey of thermoelectric studies of the group-1 metals at low temperatures carried out at the national-research-laboratories" Ottawa. Soviet Physics-Solid State 3; 1961; pp. 1024-1033.

Prasher "Thermal conductivity of composites of aligned nanosclae and microscale wires and pores" Journal of Applied Physics; 2006; vol. 100; pp. 1-9.

Qiu et al. "Large complete band gap in two-dimensional photonic crystals with elliptic air holes" Physical Review B; 1999; vol. 60; pp. 610-612.

Routkevitch et al. "Electrochemical Fabrication of CdS nanowires arrays in porous anodic aluminum oxide templates" The Journal of Physical Chemistry; 1996; vol. 100; pp. 14037-14047.

She et al. "Fabrication of vertically aligned Si nanowires and their application in a gated field emission device" Applied Physics Letters; 2006; vol. 88; article # 013112; 3 pages.

Small et al. "Modulation of thermoelectric power of individual carbon nanotubes" Physical Review Letters; 2003; vol. 91; pp. 256801-1-4.

Snyder et al. "Thermoelectric microdevice fabricated by a MEMS-like electrochemical process" Nature Material; Aug. 2003; vol. 2; pp. 528-531.

Tang et al. "Holey silicon as an efficient thermoelectric material" Nano. Letters; 2010; vol. 10; pp. 4279-4283.

Tao et al. "Langmuir-Blodgett Silver Nanowire Monolayers for Molecular Sensing Using Surface-Enhanced Raman Spectroscopy" Nano. Letters; 2003; vol. 3; p. 1229.

Trzcinski et al. "Quenched Phonon Drag in Silicon Microcontacts" Physical Review Letters; Mar. 1986; vol. 56; No. 10; pp. 1086-1089.

Vining "Desperately seeking silicon" Nature; Jan. 10, 2008; vol. 451; pp. 132-133.

Vossmeyer et al. "Light-directed assembly of nanoparticles" Angew. Chem. Int. Ed. Engl. 1997; vol. 36; pp. 1080-1083.

Wang et al. "A new type of low power thermoelectric microgenerator fabricated by nanowire array thermoelectric material" Microelectronic Engineering; 2005; vol. 77; pp. 223-229.

Wang et al. "Complementary Symmetry Silicon nanowire Logic: Power-Efficient Inverters with Gain" Small 2006; vol. 2; pp. 1153-1158.

Wang et al. "Oxidation Resistant Germanium nanowires: Bulk Synthesis, Long Chain Alkanethiol Functionalization, and Langmuir-Blodgett Assembly" Journal of the American Chemical Society; 2005; vol. 127; pp. 11871-11875.

Wang et al. "Surface Chemistry and Electrical Properties of Germanium nanowires" JACS 2004; vol. 126; pp. 11602-11611.

Wang et al. "Use of phosphine as an n-type dopant source for vapor-liquid-solid growth of silicon nanowires" Nano. Letters; 2005; vol. 5; No. 11; pp. 2139-2143.

Peng et al. "Ordered Silicon Nanowire Arrays via Nanosphere Lithography and Metal-induced Etching" Applied Physics Letters, vol. 90; 163123; 2007; 4 pages.

Weber et al. "Silicon-Nanowire Transistors with Intruded Nickel-Silicide Contacts" Nano Letters; 2006; vol. 6; No. 12; pp. 2660-2666.

Weber et al. "Transport Properties of Silicon" Applied Physics A: Solids and Surfaces; 1991; vol. 53; pp. 136-140.

Whang et al. "Large-Scale Hierarchical Organization of Nanowire Arrays for Integerated Nanosystems" Nano Letters; 2003; vol. 3, No. 9; pp. 1255-1259.

Williams "Etch Rates for Micromachining Processing" Journal of Microelectromechanical Systems; Dec. 1996; vol. 5; No. 4; pp. 256-269.

Wolfsteller et al. "Comparison of the top-down and bottom-up approach to fabricate nanowire-based silicon/germanium heterostructures" Thin Solid Films 518; 2010; pp. 2555-2561.

Wu et al. "Single-crystal metallic nanowires and metal/semiconductor nanowire heterostructures" Nature; Jul. 2004; vol. 430; pp. 61-65.

Xu et al. "Controlled Fabrication and Electrical Properties of Long Quasi-One-Dimensional Superconducting Nanowire Arrays" Nano Letters; 2008; vol. 8; No. 1; pp. 136-141.

Yablonovitch "Photonic band-gap structure" J. Opt. Soc. Am. B.; Feb. 1993; vol. 10, No. 2; pp. 283-295.

Yang et al. "Encoding Electronic Properties by Synthesis of Axial Modulation-Doped Silicon Nanowires" Science; Nov. 25, 2005; vol. 310; pp. 1304-1307.

Yang et al. "Single p-Type/Intrinsic/n-Type Silicon Nanowires as Nanoscale Avalanche Photodetectors" Nano Letters; 2006; vol. 6; No. 12; pp. 2929-2934.

Yang et al. "Thermal conductivity of simple and tubular nanowire composites in the longitudinal direction" Physical Review B; 2005; vol. 72; pp. 125418-1-7.

Lin et al. "Semimetal-semiconductor transition in Bi 1-x Sb x alloy nanowires and their thermoelectric properties" Applied Physics Letters; 2002; vol. 81; No. 13; pp. 2403-2405.

Zener "Internal Friction in Solids: I. Theory of Internal Friction in Reeds" Physical Review; Aug. 1, 1927; vol. 52; pp. 230-235.

Zener "Internal Friction in Solids: III. Experimental Demonstration of Thermoelastic Internal Friction" Physical Review; Jan. 1, 1938; vol. 53; pp. 100-101.

(56) References Cited

OTHER PUBLICATIONS

Zhong et al. "Nanowire Crossbar Arrays as Address Decoders for Integrated Nanosystems" Science; Nov. 21, 2003; vol. 302; pp. 1377-1379.
Zhou et al. "Determination of Transport Properties in Chromium Disilicide Nanowires via Combined Thermoelectric and Structural Characterizations" Nano Letters; 2007; vol. 7; No. 6; pp. 1649-1654.
Zhou et al. "Vertically Aligned $Zn_2SiO_4$ Nanotube/ZnO Nanowire Heterojunction Arrays" Small; vol. 3; No. 4; 2007; pp. 622-626.

\* cited by examiner

PHONONIC STRUCTURES AND RELATED DEVICES AND METHODS

CROSS REFERENCE TO RELATED APPLICATIONS

The present application claims priority to U.S. Provisional Application No. 61/617,546, entitled "Monolithic Phononic Superlattice Thermoelectrics", filed on Mar. 29, 2012, which is incorporated herein by reference in its entirety. The present application may be related to U.S. application Ser. No. 13/278,074, filed on Oct. 20, 2011, which is incorporated herein by reference in its entirety.

FIELD

The present disclosure relates to phononic structures. In particular, it relates to phononic structures and related devices and methods.

BACKGROUND

A phonon is generally considered a single quantum of vibrational energy that results from atomic oscillations in a material. The phonons, which can thus be considered vibrational energies, present in a material can affect thermal conductivity of the material, among other material properties. One way to control thermal conductivity of a material can be through control of phonons transporting through the material. Controlling thermal conductivity of a material independent of electrical conductivity remains challenging.

SUMMARY

According to a first aspect of the disclosure, a phononic structure is provided. The phononic structure comprises a sheet of a first material, the sheet comprising a plurality of regions, wherein adjacent regions have dissimilar phononic patterns.

According to a second aspect of the disclosure, a thermoelectric device is provided. The thermoelectric device comprises at least a first sheet and a second sheet of a semiconductor material, each of the first sheet and the second sheet comprising a first region and a second region adjacent the first region, wherein the first region and the second region have dissimilar phononic patterns; a first electrode electrically coupled to a first side of the first sheet; a second electrode electrically coupled to a first side of the second sheet; and a third electrode electrically coupled to a second side of the first sheet and the second sheet, wherein, during operation of the thermoelectric device, the first and second sides of each sheet are adapted to exhibit different temperatures.

According to a third aspect of the disclosure, a method for fabricating a phononic structure is provided. The method comprises doping a sheet of a first material; defining a plurality of regions in the sheet, wherein adjacent regions have dissimilar phononic patterns; and etching the sheet to obtain the first region and the second region, thus fabricating the phononic structure.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure Like reference numerals designate like elements throughout the specification.

DETAILED DESCRIPTION

As used in the present disclosure, the terms "phononic structure", "phononic device", "phononic material", and "phononic metamaterial" can be used interchangeably. These terms, as used herein, can refer to materials whose properties can be controlled to a degree based on artificially made design. In particular, phononic structures can be artificially designed to affect transport of phonons through the structure.

As used in the present disclosure, the terms "host material" and "starting material" can be used interchangeably and can refer to a material prior to artificial designs being effected upon the material. In many cases, the host material is a continuous material devoid of phononic features (e.g., holes patterned into the host material).

As used in the present disclosure, the term "phononic features" can refer to holes that can be patterned into a phononic structure to affect phonon band structure. Phononic features can be characterized by a set of characteristics such as, for instance, their size, pitch, wall-to-wall distance (distance equal to the pitch minus phononic feature size), and shape. Exemplary sizes may be in the range from 5 nm to 500 nm. Exemplary pitch may be in the range of 10 to 1000 nm. Exemplary shapes can include, but are not limited to, circular holes, triangular holes, quadrilateral holes, and so forth.

Figure 1A:
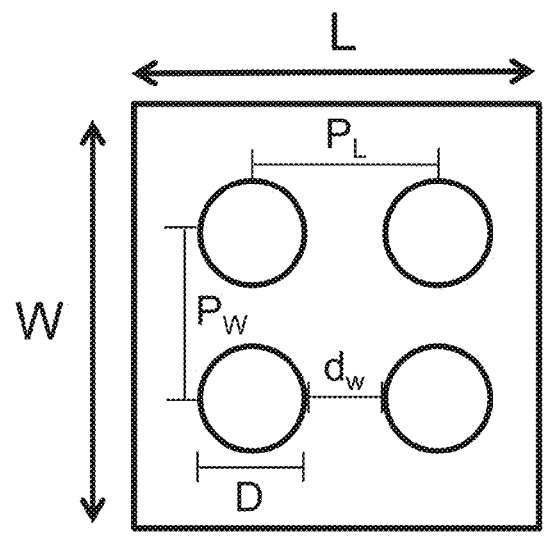
FIGS. 1A-1B show dimensional aspects of a material and phononic features patterned on the material.
Figure 1B:
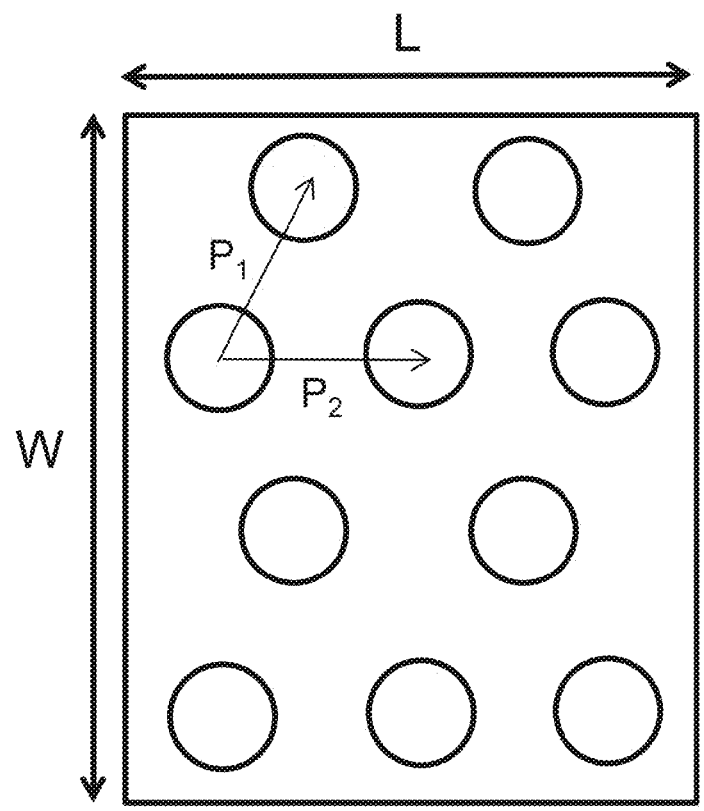

FIGS. 1A-1B show dimensional aspects of phononic features that are patterned in a material of length L and width W. For purposes of the present disclosure, FIG. 1A identifies size D of a phononic feature, pitch $P_L$ along the length of the material, pitch $P_W$ along the width of the material, and wall-to-wall distance $d_w$ between phononic features. FIG. 1B defines pitches in a case where phononic features are arranged in a hexagonal orientation. It is noted that throughout the disclosure, mentions of these dimensional aspects, such as pitch and wall-to-wall distance, apply to each of the directions within which these dimensional aspects can be measured. For example, in FIG. 1A, the pitch would refer to both $P_L$ and $P_W$. As shown in FIGS. 1A-1B, in the case of circular holes, size can be quantified by radius or diameter of the circular holes. For other shapes, size can be quantified by whichever distance appears to be appropriate or intuitive, such as size of a rectangular hole being characterized by its width and its length.

Furthermore, although terms such as, for instance, pitch and size are utilized with reference to description of each of the phononic structures, a person skilled in the art would appreciate that actual phononic features are not ideal. For example, a circular hole defined in a structure is generally not a perfect circle in practice, and the distance between adjacent phononic features might not remain a constant. Differences/tolerances from the nominal values due to such factors are appreciated by those skilled in the art and generally do not affect any teachings provided in the present disclosure.

As used in the present disclosure, the term "phononic patterns" can refer to patterns that are present (or not present) in a segment/region of a phononic structure. "Phononic patterns" includes a case where a segment/region of a phononic structure contains a particular pattern/orientation of phononic features, referred to as a patterned segment/region. "Phononic patterns" also includes a case where a segment/region of a phononic structure does not contain any phononic features, referred to as a non-patterned segment/region.

As used in the present disclosure, the term "phononic design" can refer to design of each segment of a phononic structure as well as design of combinations and arrangements of segments of the phononic structure.

As used in the present disclosure, the "phonon band structure" of a material can refer to states of phonons that can exist within the material. In many cases, the phonon band structure of a material refers to the phonon energy band structure of the material, which provides information pertaining to which energy states any phonon within the material can exist. As is well known, values of energy, frequency, and wavelength associated with a phonon are interrelated. As used herein, therefore, the term "phonon states" can refer to the range of energies, frequencies, and wavelengths that can be exhibited by the phonons.

A phonon is generally considered a single quantum of vibrational energy that results from atomic oscillations in a material. Within a given material, phonons can exist in phonon states that determine type of vibration (e.g., longitudinal, transverse, optic, and/or acoustic); energy, frequency, and wavelength of the vibration; and direction of the vibration; among other properties of the phonons. The possible phonon states within the material are described by the phonon energy band structure, also referred to simply as the phonon band structure, of the material.

Thermal conductivity of a material can be determined by phonon band structure of the material and various scattering mechanisms that can exist in the material. Some examples of scattering mechanisms can include phonon-phonon scattering, scattering from boundaries and interfaces, and phonon scattering due to impurities or defects in the material. The phonons, which can be considered vibrational energies, present in a material can thus affect thermal conductivity of the material, among other material properties. For example, thermal conductivity of a material may be determined at least in part from propagation of longitudinal acoustic phonons.

Phonons traveling through a material can be associated with a phonon mean free path, which can refer to an average distance the phonons can travel in the material unimpeded. For example, the phonon mean free path can provide the average distance phonons can travel between successive collisions, where a collision can affect direction and/or energy of the phonon or phonons undergoing the collision. More generally, phonons traveling through a material follow a probability distribution that quantifies probability that any phonon can travel through the material before the phonon is subject to a collision. The phonon mean free path quantifies the expected value (i.e., average distance) of the probability distribution. Since phonon mean free paths, or just mean free paths in general, determine length scales at which wave properties are preserved, the phonon mean free path associated with a material provides a measure of coherence lengths of the phonons traveling through the material. As is well known, coherence length provides a measure of distance a phonon can travel prior to becoming out of phase with other phonons.

Phonons traveling through a material that participate in heat transfer, thus affecting thermal conductivity of the material, can be collectively referred to as thermal phonons. As is known to a person skilled in the art, a particular group of thermal phonons in the material can provide a certain contribution to thermal conductivity of the material, where the thermal phonons that provide this certain contribution are associated with a phonon mean free path. Another group of thermal phonons that provide a different contribution to the thermal conductivity of the material are generally associated with a different mean free path. Distribution of the mean free paths resulting from the thermal phonons that can exist in the material can determine thermal conductivity of the material. Distribution of mean free paths is generally wider in bulk materials and narrower in thinner materials such as thin films and nanowires. In thin films and nanowires, the distribution is generally centered around a limiting dimension corresponding to these structures. For example, the limiting dimension generally is the film thickness in thin films and wire diameter in nanowires.

A phononic structure can be fabricated from a host material, or a combination of different host materials, by introducing phononic features in the host material or materials. Such phononic design of the host material or materials is generally performed so as to enhance in the phononic structure certain properties, dependent on application of the phononic structure, pertaining to transport of phonon as compared to the same properties in the host material or materials.

In some phononic structures, as a result of phononic design of a host material, phononic (also sometimes called acoustic) stop bands can be formed that result in blockage of certain frequencies. In such a case, ideally, phonons of frequencies within the stop bands cannot exist in the phononic structure. If these phonons carried heat in the host material, presence of the stop bands in the phononic structure can reduce propagation of heat in the phononic structure, and thermal conductivity of the phononic structure can be lower than in the host material. An example phononic structure can include a superlattice structure that can be formed of a layered, periodic structure of two or more different alternating materials.

Phononic structures can be designed to have one or more stop bands. As one example, a phononic structure can be designed so as to exhibit a single, wide stop band. As another example, a phononic structure can be designed so as to exhibit a series of smaller stop bands. A cumulative effect of the smaller stop bands can be a reduction of phonon group velocities. In a case where the phononic structures are utilized for a thermoelectric effect, presence of the one or more stop bands can allow for a reduction of thermal conductivity relative to the host material or materials that form the phononic structure.

Additional information pertaining to acoustic/phononic bandgaps and phonon group velocities can be found, for example, in references [1]-[5], each of which is incorporated herein by reference in its entirety. Additional information pertaining to lattice structures can be found, for example, in references [6]-[12], each of which is incorporated herein by reference in its entirety According to many embodiments of the present disclosure, phononic structures that can comprise structure defined at nanometer and/or micron scale are provided. In some embodiments, the phononic structures can be referred to as comprising a monolithic structure. Phononic structures with a monolithic structure can comprise a sheet of a host material, where the sheet of host material comprises a plurality of regions. Various regions in the phononic structures can be designed to contain dissimilar phononic patterns, where the patterns can be produced by nano/micro-fabrication.

In many embodiments of the present disclosure, adjacent regions defined in the sheet of host material can have dissimilar phononic patterns. For example, a first region and a second region adjacent the first region can have dissimilar phononic patterns. Adjacent regions can have dissimilar phonon energy band structures and dissimilar material properties; in other words, adjacent regions can have an acoustic mismatch.

A region as used herein is a segment of a sheet of host material. Each region of the host material can be non-patterned or patterned with a two-dimensional pattern of phononic features. In some embodiments, adjacent regions defined in the sheet of host material that have dissimilar phononic patterns can include a first region that is non-patterned and a second region adjacent the first region that is patterned. In other embodiments, adjacent regions defined in the sheet of host material that have dissimilar phononic patterns can include a first region that is patterned with phononic features of a certain set of characteristics (e.g., hole size, pitch, wall-to-wall distance, hole shape) and a second region adjacent the first region that is patterned with phononic features of a different set of characteristics. The phononic features can include, for example, holes, where each hole can be filled with a material or empty (i.e., a vacuum).

In many embodiments, the holes can be filled with a material such as a solid, a liquid, or a gaseous material. In many embodiments, the material used for filling is generally selected so as to exhibit a smaller thermal conductivity than the host material. Example materials that can be utilized as the filling material include, but are not limited to, thermal insulators, polymers (e.g., polystyrene, parylene, and so forth), glasses, ceramics, aerogels (e.g., silica, carbon, alumina, agar, chalcogen, and so forth), natural materials (e.g., cellulose), and epoxies. Other materials can be used to fill the holes.

In many embodiments of the present disclosure, the phononic structures comprise a number of regions defined in a sheet of host material, where adjacent regions generally exhibit dissimilar phonon energy band structures. For any given region, a phonon energy band structure of the particular region provides information pertaining to which energy states any phonon within the particular region can exist. As is well known, energy, frequency, and wavelength associated with a phonon are interrelated. As used herein, therefore, the term "phonon states" can refer to the range of energies, frequencies, and wavelengths that can be exhibited by the phonons. The term "phonon bandgap/stop band", sometimes also referred to as an acoustic bandgap/stop band, can refer to a range of energies (also, frequencies or wavelengths) that cannot generally be exhibited by phonons. Design of the phononic structures and regions within the phononic structures can allow for designing/controlling of the phonon energy band structures exhibited by the regions.

Consider a phononic structure fabricated from a host material that comprises one or more regions that are patterned with phononic features (e.g., holes with a particular set of characteristics). Within any of these regions that are patterned with phononic features, a phonon energy band structure different from phonon energy band structure of the host material can arise dependent on characteristics of the phononic features.

In many embodiments, a different phonon energy band structure can arise when a distance between adjacent holes, such as can be measured from center-to-center between adjacent holes (the pitch), is generally smaller than or equal to twice the mean free path of the phonons of the host material (see, for example, reference [3]). As previously mentioned, phonon mean free path provides a measure of coherence length of the phonons. It is noted that a distance between adjacent holes that is larger than twice the mean free path of the phonons of the host material (such as for example thrice the phonon mean free path) can be utilized to yield different phonon energy band structure from that of the host material. However, in general, distance between adjacent holes that is larger than twice the mean free path results in a structure whose phonon energy band structure is less dissimilar to phonon energy band structure of the host material than in the case of distance between adjacent holes that is generally smaller than or equal to twice the phonon mean free path of the host material since, in the former case, effect of phononic features defined/introduced in the host material on phonon energy band structure is reduced relative to the latter case. In other words, in cases where distance between adjacent holes that is several times larger than twice the mean free path (related to coherence length), the phononic features defined/introduced in the host material might not introduce changes (or might introduce negligible changes) to the phonon energy band structure of the host material, and the patterned host material can in effect be considered as being devoid of phononic features.

In embodiments of the present disclosure where the phononic structure is to be applied in applications where it is generally desired to control thermal conductivity without affecting electrical conductivity, such as many thermoelectric applications, to obtain a decreased thermal conductivity while avoiding a decreased electrical conductivity in a material, the wall-to-wall distance (equal to the pitch minus phononic feature size) is generally at least 10 nm and the thickness of the sheet of host material is at least 10 nm in thickness for many host materials (see, for example, reference [13], incorporated herein by reference in its entirety), such as silicon. In many host materials, pitch of the phononic features and thickness of the sheet of host material that are too small (such as smaller than 10 nm in pitch and/or thickness for many materials) can yield a phononic structure whose phononic design affects non-negligibly transport of charge (e.g., electron transport, hole transport), and thus electrical conductivity, in addition to affecting transport of phonons. Such range of values for pitch of the phononic features and thickness of the sheet of host material are exemplary. Other values for the pitch and the thickness, dependent on the host material, can also be utilized.

Size and distance considerations of phononic features, such as phononic feature size, wall-to-wall distance, and pitch are interrelated. For example, in a case of phononic features that are circular holes, the pitch is generally smaller than or equal to twice the phonon mean free path (which is related to the coherence length), but the pitch also depends on the desired hole diameter (so that adjacent holes do not overlap) and desired wall-to-wall distance between holes dependent on application (e.g., thermoelectric applications).

Exemplary sizes may be in the range from 5 nm to 500 nm. Exemplary pitch may be in the range of 10 to 1000 nm. Consider silicon as a host material. In one example, a phononic region patterned in silicon can have holes of 100 nm diameter and 200 nm pitch. As another example, a phononic region patterned in silicon can have holes of 15 nm diameter and 30 nm pitch. For instance, a phononic region patterned in silicon can have holes of 15 nm diameter and 30 nm pitch so as to ensure lower conductance but at a possible tradeoff of relative ease of fabrication and cost, among other considerations. Other size ranges are possible and dependent on considerations such as phononic structure properties (e.g., thermal conductivity, thermal conductance), ease of fabrication, and cost, among other considerations identifiable by a person skilled in the art.

Mean free paths for thermal phonons can be determined (e.g., calculated or measured) for a given material. Since phonon mean free paths, or just mean free paths in general, determine length scales at which wave properties are preserved, the phonon mean free path associated with a material provides a measure of coherence lengths of the phonons traveling through the material. As a result, mean free paths determine scale at which phononic features can be made so as to affect wave properties of phonons in the phononic structure.

As previously indicated, different groups of thermal phonons can provide a different contribution to the thermal conductivity of the material, and each group is associated with a mean free path. Distribution of mean free paths resulting from the thermal phonons that can exist in the material can determine thermal conductivity of the material. Design of the phononic regions, such as region length, pitch, phononic feature size, and wall-to-wall distance, can be made with consideration to which thermal phonons provide higher contribution to thermal conductivity of the material (among other considerations such as ease of fabrication and cost considerations). For example, phonon mean free paths associated with thermal phonons that provide higher contributions can be utilized in designing the region length, pitch, phononic feature size, and wall-to-wall distance of the phononic regions. In some embodiments, phononic design can be based around those distributions (e.g., those phonon mean free paths) associated with highest contributing thermal phonons. As used herein, such highest contributing thermal phonons can be referred to as being associated with the most prominent mean free paths in terms of thermal conductivity.

In a sheet of material, phonon mean free path values are generally a function of thickness and width of the sheet of material. The distribution of phonon mean free paths is generally narrower in thin sheets of materials than for bulk materials. The most prominent phonon mean free path values are generally a function of both thickness and width of the sheet. If the thickness of the sheet of material is larger than length of the phonon mean free path, then thermal conductivity of the sheet of material can generally be considered to be independent (or otherwise negligibly dependent) on the thickness of the sheet of material. In the case of silicon, a sheet of silicon that is thicker than around 1 μm can exhibit thermal conductivity that can be considered to be independent (or otherwise negligibly dependent) on the thickness of the sheet of silicon. An exemplary reference that describes relationships between mean free path values and scaling of dimensional aspects (e.g., thickness, width) of a sheet of material is reference [14], which is incorporated herein by reference in its entirety. Thermal conductance of the sheet of material is a function of length of the sheet of material. Length of the sheet is generally larger than width and thickness of the sheet.

In accordance with many embodiments of the present disclosure, one or more regions of a sheet of host material can be patterned with holes. Presence of these holes in the regions can affect mean free path of phonons traveling through or within the regions if the distance between the holes are smaller than thickness of the sheet. In such a case, the mean free path is a function of the distance between the holes (wall-to-wall distance) as well as sheet dimensions. As previously mentioned, a phonon energy band structure different from phonon energy band structure of the host material can arise in a region when the distance between the holes (the pitch) is smaller than or equal to twice the phonon mean free path of the phonons in the region. In many cases, phonon mean free path in such regions can be approximately defined by the shortest wall-to-wall distance present in the region, and in this case the shortest wall-to-wall distance can be considered a critical or limiting dimension.

It is noted that in accordance with many embodiments of the present disclosure, regions in the phononic structure can be designed so as to exhibit dissimilar phonon energy band structures and dissimilar material properties. As is well known, at the microscopic or even macroscopic level, different areas of a single material may possess different material properties (e.g., resistance, thermal conductance, etc.) by virtue of tolerances in fabrication processes, material imperfections and impurities, and so forth. In the present disclosure, dissimilar phonon energy band structures and dissimilar material properties are a function of design and fabrication of phononic structures. Specifically, the dissimilar phonon energy band structures and dissimilar material properties between regions of the phononic structure are at least in part due to defining and patterning (or lack thereof) of the regions.

Figure 2A:
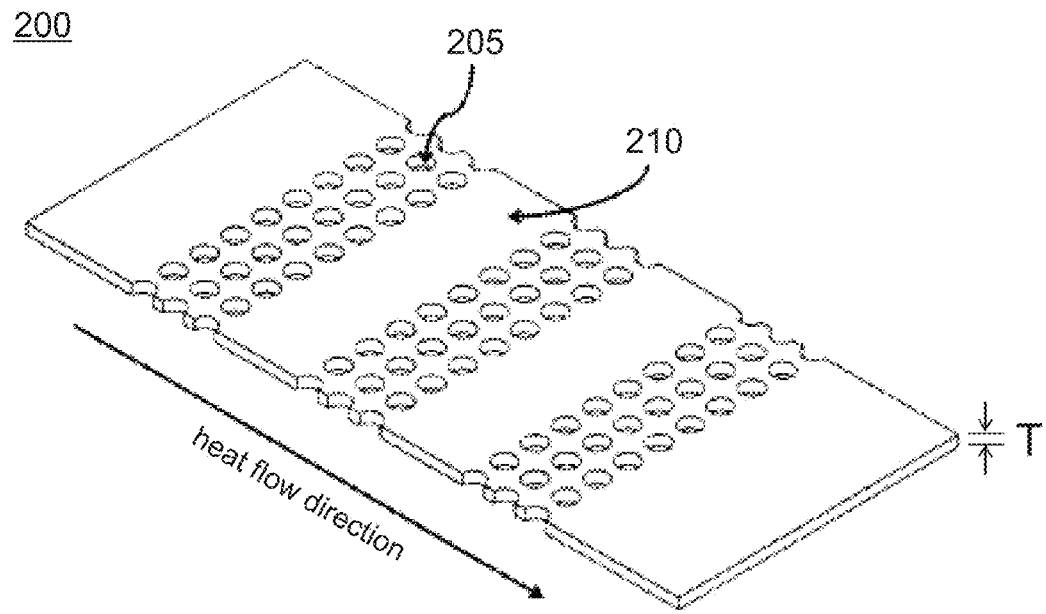
FIG. 2A shows a phononic structure that comprises a monolithic structure in accordance with an embodiment of the present disclosure.

FIG. 2A shows a phononic structure (200) that comprises a monolithic structure in accordance with an embodiment of the present disclosure. The phononic structure (200) comprises a sheet of material of thickness T, where the sheet of material can be partitioned into a plurality of regions. The sheet of material can have a pattern, produced by nano/microfabrication, that comprises an alternating structure of regions with phononic features (e.g., holes) and devoid of phononic features (e.g., holes). In particular, the phononic structure (200) comprises a first region (205), which is patterned with holes, and a second region (210), which is devoid of holes. As shown in FIG. 2A, the phononic structure (200) can contain more than two regions. During use of the phononic structure (200), such as use of the phononic structure (200) as an insulating material and/or in a thermoelectric device, the phononic structure (200) is generally configured such that phonons, and thus heat, can travel along the length of the phononic structure (200) that passes through the various regions in the phononic structure (200), as indicated in FIG. 2A. During use, heat may be applied to the phononic structure (200) such that a left side of the phononic structure (200) can be considered a hot side and a right side of the phononic structure (200) can be considered a cold side. It is noted that the holes in the first region (205) can be filled with a material different from the host material.

Figure 2B:
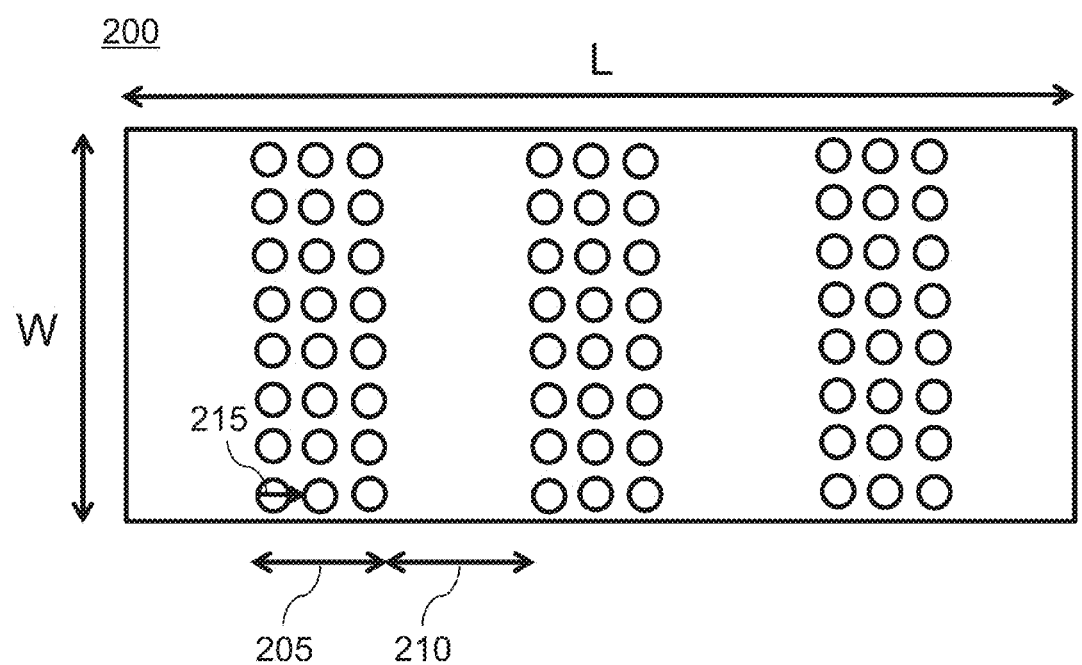
FIG. 2B shows a top view of the phononic structure shown in FIG. 2A.

FIG. 2B shows a top view of phononic structure (200) shown in FIG. 2A and illustrates width W and length L of the phononic structure (200) as well as the first region (205) and the second region (210) (among other regions that have not been labeled with reference numerals). With reference to FIGS. 2A-2B, the phononic structure (200) is generally configured such that phonons, and thus heat, can travel along the length L of the phononic structure (200) that passes through the various regions in the phononic structure (200).

Additionally, FIG. 2B shows a pitch (215) of phononic features within the first region (205). In particular, the pitch (215) is shown as a distance between a point on a first phononic feature and a corresponding point on a second phononic feature, where the two phononic features are displaced along any two-dimensional direction (e.g., left to right, top to bottom, etc.) in the phononic structure (200). More generally, as used herein, the term "phononic pitch" or simply "pitch" can refer to a distance between a point on or in a first phononic feature and a corresponding point on or in a second phononic feature adjacent the first phononic feature along any direction. In many cases, for symmetric shapes including, but not limited to, circles, triangles, quadrilaterals (e.g., squares, rectangles), and so forth, the pitch can be used to refer to a center-to-center distance between the first phononic feature and the second phononic feature.

The first region (205) and the second region (210) of the phononic structure (200) can have dissimilar phonon energy band structures in view of their dissimilar patterns. As a result of the dissimilar phonon energy band structures, the first region (205) and the second region (210) can exhibit dissimilar material properties, including thermal conductivity and thermal conductance, and can exhibit dissimilar phonon group velocities. The meeting of the first region (205) and the second region (210) forms a phononic interface, which is an interface formed by two dissimilar phonon band structures.

From a related standpoint, phonons are generally slower in regions with holes, such as the first region (205), than in regions devoid of holes, such as the second region (210). The difference in phonon speed in the first and second regions (205, 210) can result in phononic interfaces at a transition between the two regions (205, 210). With this difference in phonon speed at the different interfaces, phonons have a higher probability of being scattered due to presence of these interfaces relative to a case of a continuous sheet of host material. Thermal and thermoelectric properties can be measured in a direction perpendicular to the interfaces.

The sheet of host material that comprises the phononic structure (200) can be, for example, crystalline silicon. Materials such as graphene, diamond, germanium, silicongermanium, and lead-telluride can be used. Other materials can be utilized as well. Silicon can be utilized as the host material of the sheet in the phononic structure (200), for example, in semiconductor and/or thermoelectric applications. Since electrons have smaller length scales than the phononic pattern of holes, electrons passing through the phononic structure (200) can pass through phononic regions and phononic interfaces with no scattering (or negligible scattering) due to presence of these phononic regions and phononic interfaces. Although the phononic features can, probabilistically, scatter charge (e.g., electrons, holes) to some extent, discontinuity/dissimilarity between phonon energy band structures at the phononic interfaces generally has no effect by design on transport of charge (e.g., electrons, holes) through the phononic structure (200). In other words, the phononic structure (200) can be designed such that the electrons pass through the phononic structure (200) as if it were a substantially continuous material. Phonons passing through the phononic structure (200) can be scattered due to the different phononic regions and phononic interfaces.

A combination of such features can yield a phononic structure with a series of interfaces created to affect (such as impede) transfer of heat transferring phonons and not affect or affect negligibly transfer of charge (e.g., electrons, holes). As a result, thermal conductivity is affected whereas electrical conductivity is not affected or only negligibly affected. The phononic structure can be referred to as a phonon-blocking, electron transmitting material. By designing the phononic structure (200) to have regions (205, 210) of different phononic patterns, the phononic structure (200) can achieve higher efficiency than in the starting silicon material or starting silicon material patterned with only one continuous phononic region. It is noted that the efficiency is inversely proportional to thermal conductivity.

It is noted that the phononic structure (200) shown in FIGS. 2A-2B can be referred to as having a superlattice structure. For example, the superlattice period of the phononic structure (200) can be defined as a region devoid of holes followed by a region patterned with holes. In FIGS. 2A-2B, the phononic structure (200) contains three full superlattice periods and a half period provided by a region devoid of holes. Along the width W of the phononic structure (200), both electrical and thermal conductance of the phononic structure (200) generally follow the rule of conductance addition for varying widths. Specifically, as the width increases, thermal conductance increases (and thermal resistance decreases). Along the length L of the phononic structure (200), thermal resistance of the phononic structure (200) generally does not follow the rule of resistance addition. In contrast, in many embodiments of design of the phononic structure, electrical resistance does follow the rule of resistance addition.

Figure 3:
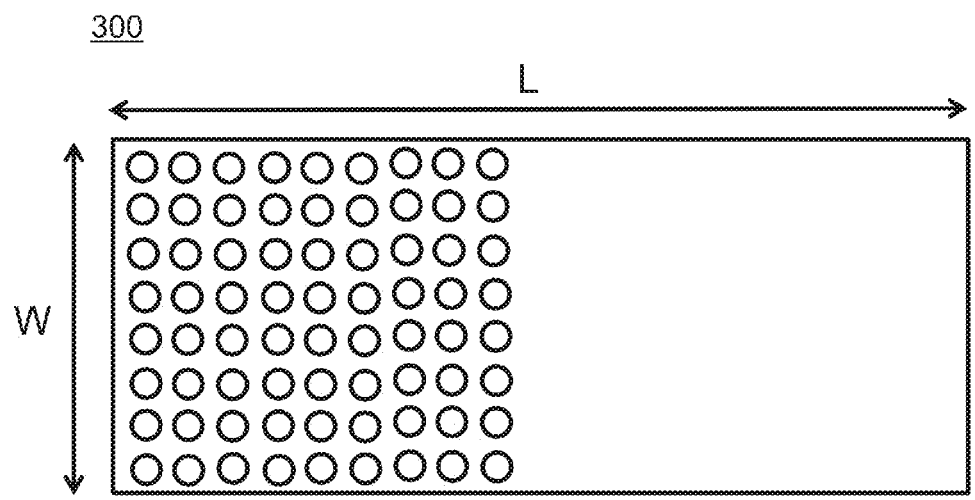
FIG. 3 shows a top view of a phononic structure that comprises a monolithic structure in accordance with an embodiment of the present disclosure. The phononic structure shown in FIG. 3 comprises a different orientation of regions from those in the phononic structure shown in FIGS. 2A-2B.

The phononic structure (200) can be considered to contain three regions of a first type R1 (e.g., regions defined by a specific number of holes and specific spacing between the holes) and four regions of a second type R2 (e.g., regions devoid of holes). In particular, the phononic structure (200) shown in FIGS. 2A-2B contains a pattern of regions of R2, R1, R2, R1, R2, R1, and R2. Consider another phononic structure (300), shown in FIG. 3, that comprises three adjacent R1 regions followed by four adjacent R2 regions. Although the individual regions present in FIGS. 2A-2B versus FIG. 3 are the same (e.g., three R1 regions and four R2 regions), the thermal conductance of the phononic structure (200) shown in FIGS. 2A-2B are generally different from the thermal conductance of the phononic structure (300) shown in FIG. 3. Specifically, the phononic structure (200) of FIGS. 2A-2B comprises six interfaces whereas the phononic structure (300) of FIG. 3 comprises one interface. Each of the interfaces generally affects thermal conductance of the phononic structure. The phononic structure (300) of FIG. 3 can be considered as having two regions (three R1 regions being a first region and four R2 regions being a second region) with one interface between these two regions. As will be described in further detail below, thermal conductivity is generally a function of number of phononic regions and interfaces and phononic design of each of these regions. In contrast, the phononic structures are designed in many embodiments such that although thermal conductivities/conductances are affected by the phononic interfaces, electrical conductivities/conductances are not affected by design.

In general, according to many embodiments of the present disclosure, such as depicted in FIGS. 2A-2B, a phononic structure can comprise a sheet of host material, where the sheet of host material comprises a number of regions. Thickness of the sheet of material can be chosen based on considerations such as applications in which the phononic structure is to be employed, cost considerations (e.g., cost of material), fabrication considerations, and so forth.

Once the thickness of the sheet of material is chosen or otherwise set, phononic features (e.g., holes of certain characteristics) patterned/defined in one or more regions of the sheet of material are generally placed at a distance within twice the thickness of the sheet of material. In a case of circular holes, a largest possible diameter of a hole is generally about the same as the film thickness. In this case, the film thickness can be considered the limiting dimension. Specifically, in cases where the film thickness is too small, coherence can constrained by the low thickness, and phonons traveling through the film on average scatter prior to (probabilistically) encountering a hole. As a result, the patterning of the film with holes in such a case might not affect transport of phonons, including heat transferring phonons. If the holes are placed closer than the film thickness, either by making holes with a diameter larger than the film thickness or by making smaller holes placed close together, the limiting dimension can be described by that separation between the holes and the holes can be placed generally at a pitch smaller or equal to twice this limiting dimension. It is noted that the pitch is also larger than distance between the holes, since holes would begin to overlap in the case that pitch is smaller than or equal to distance between the holes.

Length of any region, either patterned or non-patterned, that can create an interface is generally longer than the mean free path of most thermal phonons that can exist in the material. As an example, a 500 nm thick sheet of silicon with 50 nm holes at 50 nm separation is generally associated with regions not less than 150 nm. Specifically, one period of holes can include a column of 50 nm holes, followed by a 50 nm separation for each hole, and followed by another column of 50 nm holes to obtain a minimum region size of 150 nm from these two columns of holes. The distance between the holes can be as small as 10 nm in order not to significantly disrupt electrical conductivity. Which exact geometry is chosen to achieve desired performance of the phononic structure or a device that employs the phononic structure, based on such properties as not only thermal conductivity but also electrical conductivity and thermopower, among other properties that may be relevant depending on application.

According to many embodiments of the present disclosure, phononic interfaces are formed between two regions of the phononic structure. Consider a phononic structure that includes a patterned region in a continuous sheet of host material. If the patterned region meets a non-patterned region in the continuous sheet of host material or meets a patterned region that contains a different two-dimensional phononic pattern, either of which results in a dissimilar phonon energy band structure, an interface between the regions of dissimilar phonon energy band structure can be referred to as a phononic interface. In general, a larger difference in phonon energy band structure between any two regions (e.g., larger difference in allowed phonon states between any two regions) is associated with a larger effect on reduction of thermal conductivity of the phononic structure. As previously indicated, the phononic structures are designed in many embodiments such that although thermal conductivities/conductances are affected by the phononic interfaces, electrical conductivities/conductances are not affected by design due at least in part to different length scales of phonon transport compared to length scales of charge (e.g., electron, hole) transport.

The dissimilar phonon energy band structure between the regions can be considered an example of an acoustic mismatch between the regions. When two regions of dissimilar phonon energy band structure are in contact, set of possible phonon states going from the first region into the second region does not match. At such interfaces with dissimilar phonon energy band structures, phonons carrying heat will scatter at higher probabilities at such interfaces relative to a case of a continuous host material and thus phonons will transmit from the first region to the second region at lower probabilities relative to the case of a continuous host material. This scattering is a result of acoustic mismatch and can be considered a measure of the interface's resistance to thermal flow (and referred to as Kapitza resistance), thus reducing thermal conductivity. A larger mismatch in phonon energy states between the two regions generally leads to more scattering. In general, length of the regions that define the interface are longer than twice the mean free path.

As another example of a phononic structure in accordance with many embodiments of the present disclosure, a phononic structure can comprise a sheet of material comprising a plurality of regions, including at least a first region and a second region. The first region can be defined by holes of a certain size, pitch, wall-to-wall distance, and shape and the second region can be defined by holes of a different size, pitch, wall-to-wall distance, and/or shape. The holes in the first and second region can be filled with the same material or different material. Example values for diameter of the holes are 10-1000 nanometers. Example values for pitch (distance) between centers of adjacent holes are 20-2000 nanometers. Separation between the holes is generally not larger than twice the thickness of the sheet of material.

Figure 4:
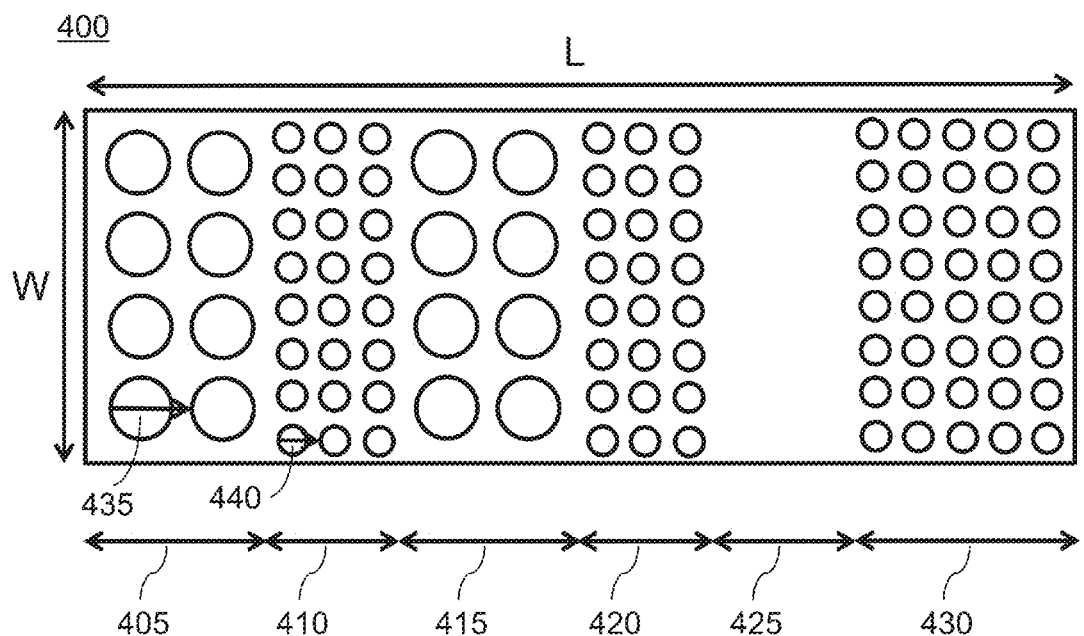
FIGS. 4-6 show top views of phononic structures that comprise a monolithic structure in accordance with embodiments of the present disclosure.

FIG. 4 shows a top view of a phononic structure (400) that comprises a monolithic structure in accordance with an embodiment of the present disclosure. The phononic structure (400) comprises a sheet of material of thickness T, width W, and length L, where the sheet of material can be partitioned into a plurality of regions. In particular, the phononic structure (400) comprises six regions (405, 410, 415, 420, 425, 430), which are referred to as a first region (405), a second region (415), a third region (420), a fourth region (425), a fifth region (430), and a sixth region (435).

During use of the phononic structure (400), such as use of the phononic structure (400) as an insulating material and/or in a thermoelectric device, the phononic structure (400) is generally configured such that phonons, and thus heat, can travel along the length L of the phononic structure (400) that passes through the various regions (405, 410, 415, 420, 425, 430) in the phononic structure (400).

With reference to FIG. 4, the first region (405) and the third region (415) nominally contain identical phononic features with a pitch (435) whereas the second region (410), the fourth region (420), and the sixth region (430) nominally contain identical phononic features with a pitch (440). In particular, the sixth region (430) nominally contains identical phononic features as the second (410) and fourth (420) regions but is of different length from the second (410) and fourth (420) regions. The fifth region (425) is a non-patterned region and thus exhibits phonon energy band structure of the host material.

Along the width W of the phononic structure (400), both electrical and thermal conductance of the phononic structure (400) follow the rule of conductance addition for varying widths. Along the length L of the phononic structure (400), thermal resistance of the phononic structure (400) generally does not follow the rule of resistance addition. Specifically, thermal resistance of the phononic structure (400) involves a resistance addition of each of the regions in addition to resistance from each interface (each transition from one region to another region). In particular, the phononic structure (400) depicts five transitions, where each transition is defined between two regions. As previously mentioned, each interface generally reduces thermal conductivity of the phononic structure (400) due to increased scattering at the interface.

Figure 5:
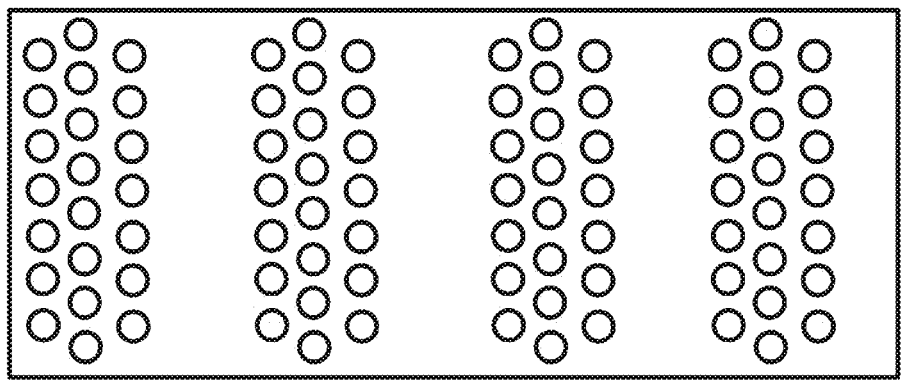
Figure 6:
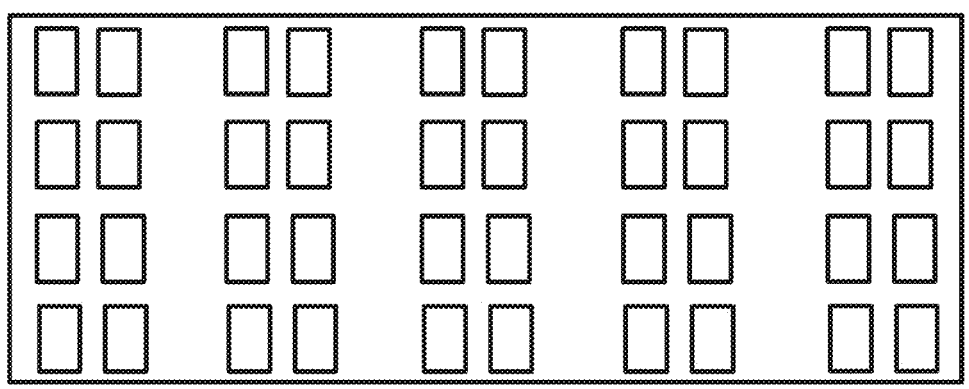

FIGS. 5-6 show top views of phononic structures that comprise a monolithic structure in accordance with embodiments of the present disclosure. In particular, FIG. 5 shows a phononic structure where phononic features in a patterned region exhibit a hexagonal orientation. FIG. 6 shows a phononic structure whose phononic features are rectangular in shape.

It is noted that the particular combination of phononic regions shown in FIGS. 2A-2B, and FIGS. 3-6 is exemplary and dependent on considerations such as application, cost, ease of fabrication, and so forth. Furthermore, although terms such as, for instance, pitch, phononic feature size, and wall-to-wall distance are utilized with reference to description of each of the phononic structures, a person skilled in the art would appreciate that actual phononic features are not ideal. For example, a circular hole defined in a structure is generally not a perfect circle in practice, and the distance between adjacent phononic features might not remain a constant. Furthermore, mean free paths of phonons (or charges such as electrons and holes) are generally also estimates made based on probability. Differences/tolerances from the nominal values due to such factors are appreciated by those skilled in the art and generally do not affect any teachings provided in the present disclosure.

Figure 7A:
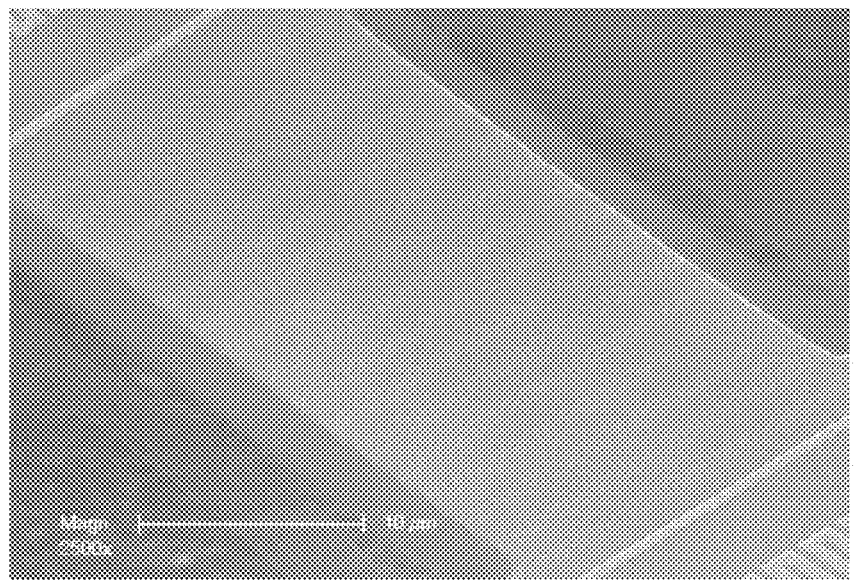
FIGS. 7A-7D show scanning electron microscope images of various monolithic phononic structures in accordance with embodiments of the present disclosure.
Figure 7B:
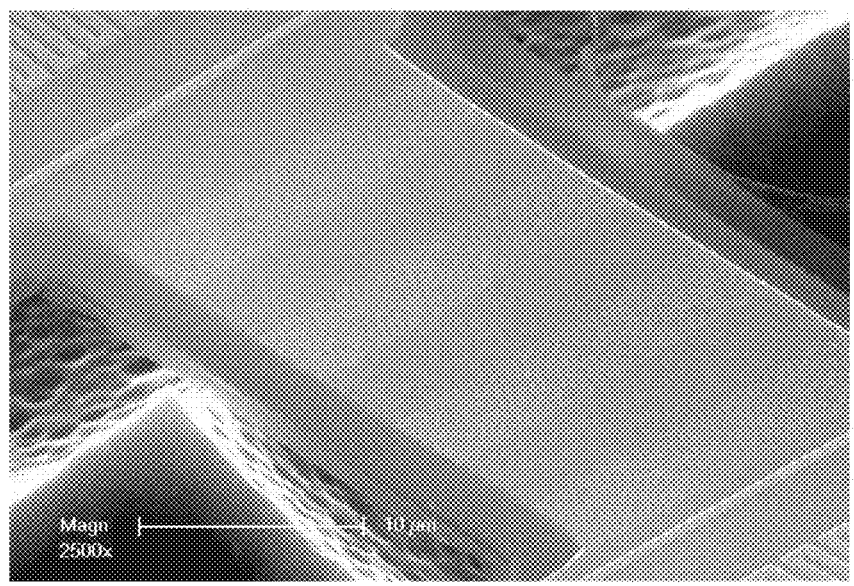
Figure 7C:
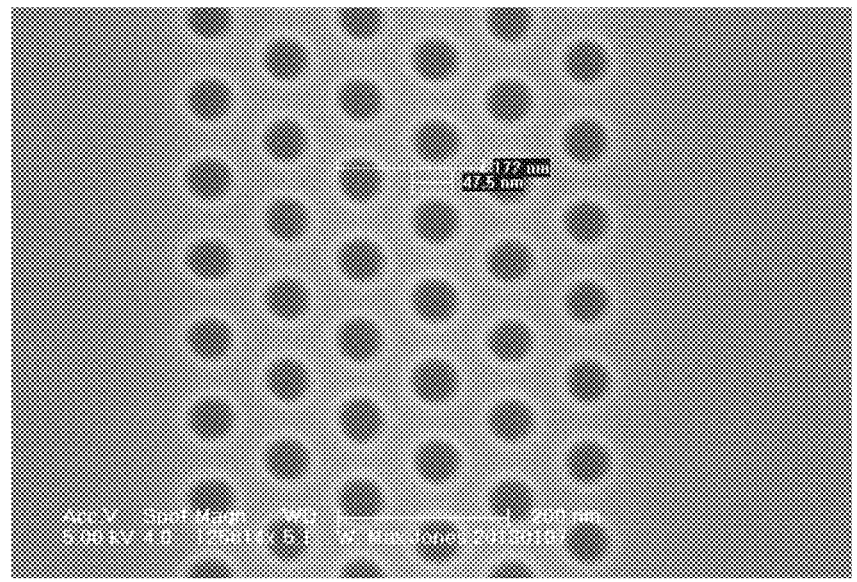
Figure 7D:
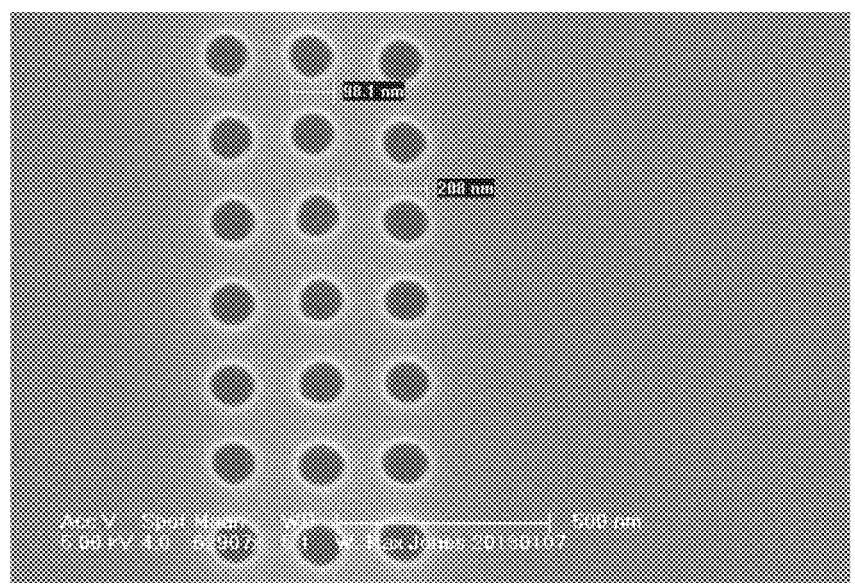

FIGS. 7A-7D show scanning electron microscope (SEM) images of various monolithic phononic structures in accordance with embodiments of the present disclosure. FIGS. 7A-7B show a phononic structure that comprises sixteen regions and eight regions, respectively. FIG. 7C shows a phononic structure whose holes are arranged in a hexagonal orientation. FIG. 7D shows an SEM image of a thin film of silicon that is approximately 300 nm thick, has a pitch of around 200 nm between holes, and has a hole size of around 100 nm in diameter.

In many embodiments of the present disclosure, phononic structures can be utilized as a thermoelectric device or as a part of a thermoelectric device. As is known to one skilled in the art of thermoelectrics, thermoelectric effects are effects pertaining to conversions of temperature differences to an electric voltage, and vice versa. In certain applications of thermoelectric devices, the thermoelectric devices generally employ one or more materials having low thermal conductivity $\kappa$ and high electrical conductivity $\sigma$ for increased device performance at least with respect to the thermoelectric effect. Materials with such properties can be referred to as thermoelectric materials.

A figure of merit generally associated with a thermoelectric material can be denoted by ZT and can be defined by $$ZT = \frac{\sigma S^2 T}{\kappa}$$

where S is the Seebeck coefficient (also referred to as thermopower), T is the temperature, $\kappa$ is the thermal conductivity, and $\sigma$ is the electrical conductivity of the thermoelectric material. In general, a material with a higher ZT value exhibits a stronger thermoelectric effect. Specifically, consider a first material and a second material, where the first material has a stronger thermoelectric effect than the second material. For the two materials to generate a same electric voltage, the first material would generally involve a smaller temperature difference between two sides of the first material than the second material. It is noted that $\sigma S^2$ is effectively a product between electrical conductivity of a material and capability of the material to convert voltage differences to temperature differences (or vice versa) and can be referred to as a power factor. The power factor can be utilized as an indication of electrical and thermoelectric properties of the material.

In accordance with many embodiments of the present disclosure, a monolithic phononic structure is a structure in which a sheet of a single material is patterned so that it incorporates a number of phononic interfaces. Thermal conductance of the phononic structure is a function of the thermal conductivity of the regions (i.e., segments/components of the phononic structure) as well as the number of interfaces. Generally, for thermoelectric applications, the phononic structure can be designed such that phononic features within each region increases scattering and thus reduces thermal conductance while not affecting electrical conductance. Additionally, presence of each interface in the phononic structure reduces overall thermal conductance of the phononic structure.

Monolithic design of the phononic structure, which includes defining of the regions themselves (e.g., patterned or non-patterned, phononic features present in patterned regions, and so forth) as well as the combination/arrangement of regions, can aid in ensuring that transport of electrons (and thus electrical conductance) is not affected by design (or only negligibly affected) by the phononic features introduced in the host material. In terms of electrical conductance, the phononic structure generally has electrical properties similar to the host material. Therefore, in a thin film of host material, one can get the desired electrical properties (generally the electrical conductivity $\sigma$ and thermopower S) by optimizing the thin film (e.g., by doping the semiconducting thin film until a desired power factor $\sigma S^2$ is obtained). Then, the monolithic phononic design is applied to reduce thermal conductivity until a desired thermal conductivity is met or there is little substantial effect on thermal conductivity from adding more interfaces or otherwise cost and practicality of fabrication takes effect. To affect thermal properties of the phononic structures, additional regions can be added and/or design of existing regions in the host material can be adjusted.

According to many embodiments of the present disclosure, a thermoelectric device is provided. The thermoelectric device can comprise at least two sheets of a semiconductor material, where each sheet can be partitioned into a plurality of regions. Each sheet can be partitioned into at least a first region and a second region, and each of the first and second regions can have dissimilar phononic patterns. The thermoelectric device can further comprise a first electrode electrically coupled to a first side of the first sheet; a second electrode electric electrically coupled to a first side of the second sheet; and a third electrode electrically coupled to a second side of the first sheet and second sheet. A temperature difference can be applied between each side of the sheet, and an electrical voltage can be generated between the electrodes. The first and second sides of each sheet can be respectively, for example, a cold side and a hot side of the sheets, or vice versa. The thermoelectric device can comprise at least two phononic structures, where each phononic structure is in accordance with many embodiments of the present disclosure.

As previously mentioned, in many embodiments of the present disclosure, phononic structures can be designed with properties of a thermoelectric material. Such phononic structures are generally designed to have higher ZT than host materials employed in the phononic structures. In some cases, the phononic structures can be designed such that the higher ZT results at least in part from a lower thermal conductivity K than the starting materials. The phononic structures are generally designed to involve reduction in thermal conductivity independent of changes in electrical conductivity. In many applications, such as many thermoelectric applications, the phononic structures are generally designed such that a reduction in thermal conductivity is accompanied with negligible effect on electric conductivity.

Thermoelectric devices can be used, by way of example, in thermoelectric coolers/heaters and in thermoelectric electricity generation. The thermoelectric devices can convert heat into electricity and can be cooled when supplied with electricity.

Figure 8A:
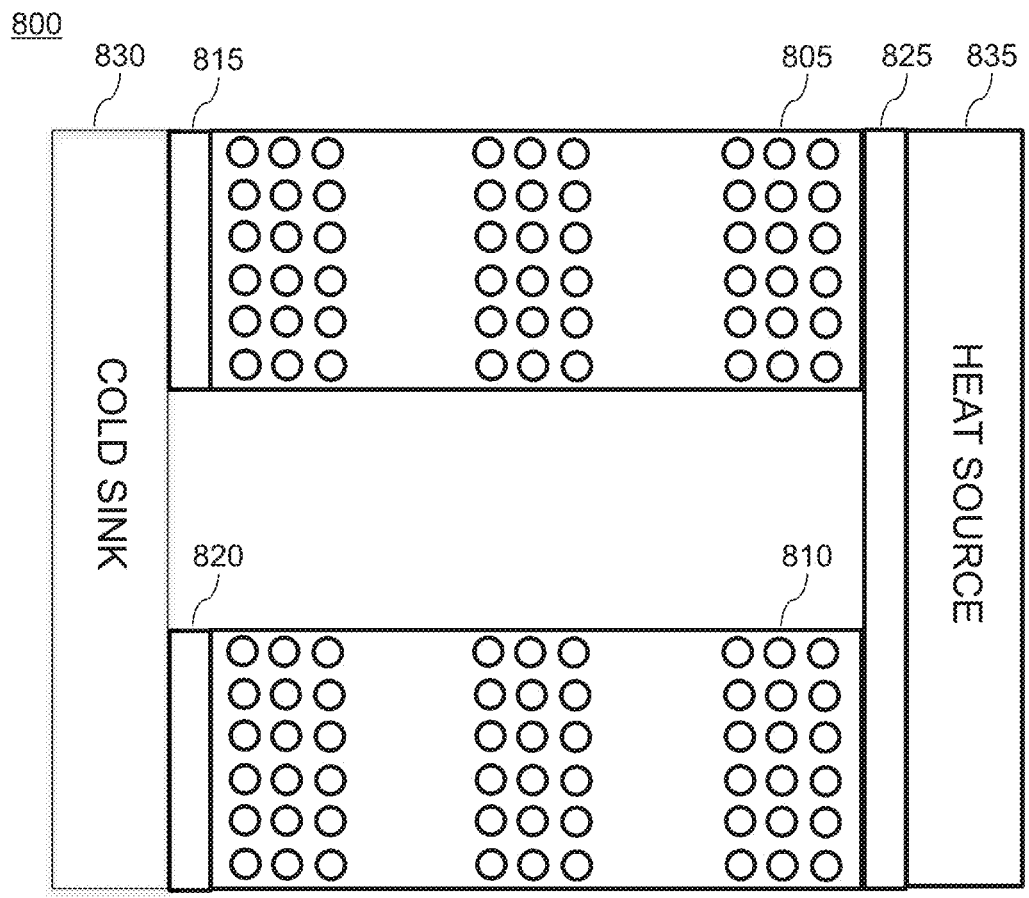
FIGS. 8A-8B show a thermoelectric device in accordance with embodiments of the present disclosure.

FIG. 8A shows a thermoelectric device (800) comprising phononic structures in accordance with embodiments of the present disclosure. The thermoelectric device (800) comprises a first phononic structure (805) and a second phononic structure (810), where each phononic structure (805, 810) can be in accordance with the embodiments of the present disclosure. Each phononic structure (805, 810) can comprise a sheet of material (generally semiconductor material), and the sheet can be partitioned into a plurality of regions. The sheet associated with the first phononic structure (805) can be doped with an n-type dopant whereas the sheet associated with the second phononic structure (810) can be doped with a p-type dopant, or vice versa. The thermoelectric device (800) further comprises a set of electrodes (815, 820) electrically coupled to a first side of each sheet and an electrode (825) electrically coupled to a second side of each sheet. The phononic structures (805, 810) therefore can form a p-n junction, and the p-n junction can be referred to as a thermoelectric module. A temperature difference can be applied between each side of the sheet using a cold sink (830) and a heat source (835), and an electrical voltage can be generated between the set of electrodes (815, 820) and the electrode (825).

Figure 8B:
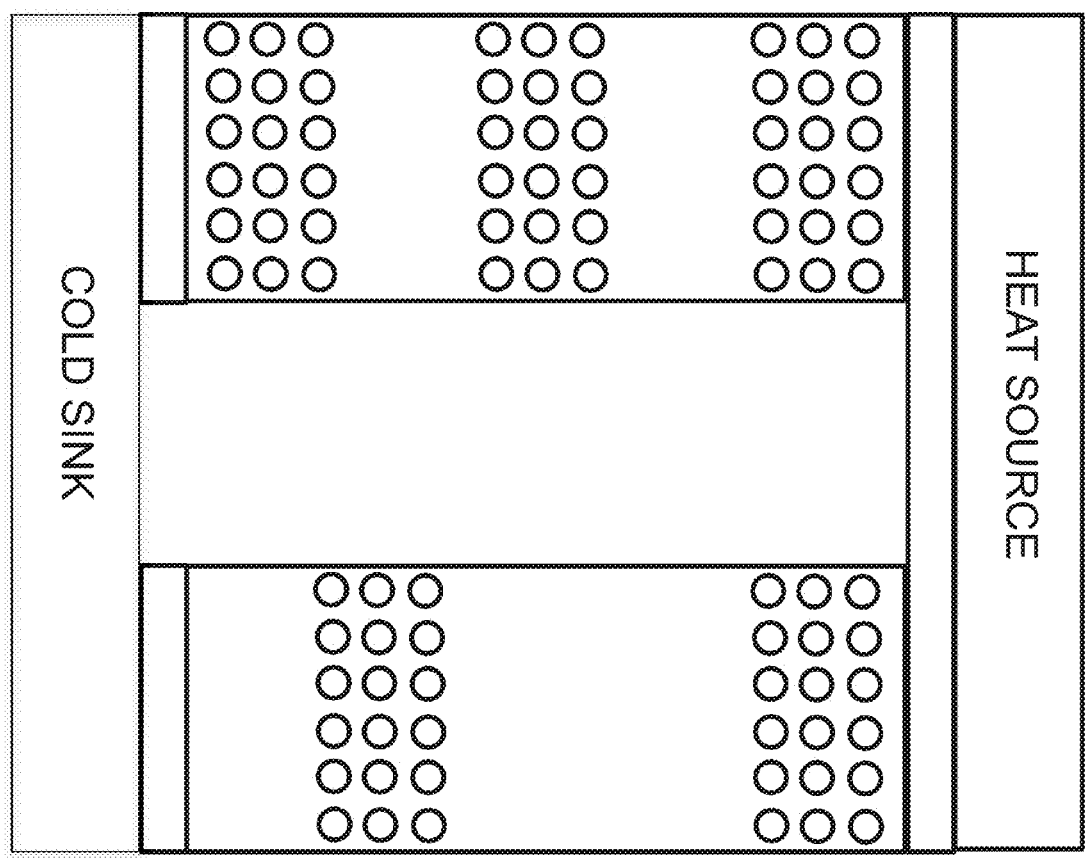

It is noted that in many embodiments, such as shown in FIG. 8A, the phononic structures (805, 810) can be, by design, identical to each other aside from dopant and doping. In some embodiments, such as shown in FIG. 8B, design of phononic structures in the thermoelectric device may be different.

The thermoelectric device (800) can be utilized as a thermoelectric generator/cooler. The thermoelectric device (800) can comprise more than one thermoelectric module, where each thermoelectric module can comprise a p-n junction of semiconducting thermoelectric materials. For example, to add additional thermoelectric modules, the n-type sheet (805) can be electrically coupled to another p-type sheet (not shown) via electrode (815) whereas the p-type sheet (810) can be electrically coupled to another n-type sheet (not shown) via electrode (820). In accordance with many embodiments of the present disclosure, a semiconducting thermoelectric material that can be made in both p-type and n-type variants, and the p- and n-type variants can be utilized in forming a thermoelectric module.

In accordance with many embodiments of the present disclosure, a method for fabricating a phononic structure is provided. First, a sheet of material (e.g., silicon) can be chosen and doped to obtain a desired power factor $\sigma S^2$. A series of regions can be defined in the sheet of material, where adjacent regions have dissimilar phononic patterns. The sheet can then be patterned into the series of regions, where each region can be patterned with holes (patterned region) or devoid of holes (non-patterned region). The holes can be arranged in a variety of orientations including, by way of example and not of limitation, a square orientation or a hexagonal orientation. Many fabrication methods can be utilized to form the patterns in the regions. One example involves fabricating patterned regions via electron beam lithography in electron beam resist, and transferring the pattern into the material (e.g., semiconducting material) by reactive-ion etching.

For example, the method for fabricating a phononic structure can be performed either on standalone semiconducting thin films or on supported films (such as silicon-on-insulator wafers). The thin film of a semiconductor can be doped to a desired power factor $\sigma S^2$. A nanopatterning technique can be applied to define the hole patterns across the film, and the holes would be etched with a suitable method for the given material. Patterning techniques can include lithography (e.g., electron beam lithography, interference lithography, and so forth) and etching techniques can include dry etching (e.g., plasma based etching) or wet etching (e.g., electroless etching). These techniques, as well as others, are well known to the semiconducting industry and people skilled in the arts.

In accordance with many embodiments of the present disclosure, a method for fabricating a thermoelectric device is provided. First, a sheet of semiconducting material (e.g., silicon) can be chosen and doped to obtain a desired power factor $\sigma S^2$. Both n- and p-type sheets can be made to form a thermoelectric module. It is noted that how sheets are prepared depends at least in part on packaging of the thermoelectric module. A series of regions can then be defined, via patterning techniques, in the sheet of material. The sheets can be patterned into a series of regions, where each region can be patterned with holes (patterned region) or devoid of holes (non-patterned region). The holes can be arranged in a variety of orientations including, by way of example and not of limitation, a square orientation or a hexagonal orientation. Many fabrication methods can be utilized to form the patterns in the regions. One example involves fabricating patterned regions via electron beam lithography in electron beam resist, and transferring the pattern into the semiconducting material by reactive-ion etching.

In many embodiments of the present disclosure, the host material of the phononic structure can be a semiconducting material. The semiconducting material can be a high thermal conductivity semiconducting material, which generally have longer mean free paths and thus can be associated with larger phononic features. Materials like this are generally single element semiconductors, such as silicon (e.g., bulk material) and graphene (e.g., thin film material). Other semiconducting materials with shorter mean free paths, such as silicon-germanium and lead-telluride, can be used as well. The features in these other semiconducting materials are generally smaller than in materials of longer mean free paths.

In many embodiments of the present disclosure, the phononic features (e.g., holes) can be filled with a material such as a solid, a liquid, or a gaseous material. The material used for filling is generally selected so as to exhibit a lower thermal conductivity than the host material. Example materials that can be utilized as the filling material include thermal insulators, polymers (e.g., polystyrene, parylene, and so forth), glasses, ceramics, aerogels (e.g., silica, carbon, alumina, agar, chalcogen, and so forth), natural materials (e.g., cellulose), and epoxies. Other materials can be used to fill the holes.

It is further noted that, in many embodiments of the present disclosure, phononic features in different regions of a phononic structure can be filled with different materials. For instance, phononic features in one region can be filled with one material, phononic features in another region can be filled with another material, phononic features in yet another region can be filled with yet another material, and so forth. In general, the materials used for filling are selected so as to exhibit lower thermal conductivities than the host material. Example filling materials are those as provided above (e.g., thermal insulators, polymers, glasses, ceramics, aerogels, natural materials, and epoxies).

The examples set forth above are provided to give those of ordinary skill in the art a complete disclosure and description of how to make and use the embodiments of the phononic structures and related devices and methods of the disclosure, and are not intended to limit the scope of what the inventors regard as their disclosure. Modifications of the above-described modes for carrying out the disclosure can be used by persons of skill in the art, and are intended to be within the scope of the following claims.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

LIST OF REFERENCES

[1] U.S. Patent Application Publication No. 2012/0097204
[2] U.S. Pat. No. 8,094,023
[3] Yu, J.-K. et al. "Reduction of thermal conductivity in phononic nanomesh structures." Nature Nanotechnology, October 2010, Volume 5, pages 718-721.
[4] Yu, J.-K. et al. "Thermal conductivity in phononic nanomesh structures." Nature Nanotechnology, October 2010, Volume 5, pages 1-14. (provides supplemental information for reference [3]).
[5] Hopkins, P. E. et al. "Reduction in the Thermal Conductivity of Single Crystalline Silicon by Phononic Crystal Patterning." Nano Letters 2011, 11, pages 107-112.
[6] U.S. Patent Application Publication No. 2007/0028956
[7] U.S. Pat. No. 6,452,206
[8] U.S. Patent Application Publication No. 2003/0099279
[9] U.S. Patent Application Publication No. 2012/0298928
[10] U.S. Patent Application Publication No. 2012/0227663
[11] U.S. Patent Application Publication No. 2012/0216848
[12] U.S. Pat. No. 5,415,699
[13] Zhang, P. P. et al. "Electronic transport in nanometre-scale silicon-on-insulator membranes." Nature Letters, February 2006, Volume 439, pages 703-706.
[14] Dames, C. & Chen, G. in Thermoelectrics Handbook: Macro to Nano (ed. Rowe, D. M.) (CRC Press, 2006)

What is claimed is:

1. A phononic structure, comprising:
   a sheet of a first material, the sheet comprising a plurality of regions, wherein adjacent regions have dissimilar phononic patterns and are configured to carry a heat flow along the longitudinal axis of the phononic structure,
   wherein:
   each region has a length perpendicularly to the longitudinal axis of the phononic structure, the length being more than twice a phonon mean free path of the first material, and
   the plurality of regions comprises at least a first region and a second region adjacent the first region, the first region comprising a period pattern of holes in the first material and the second region comprising the first material devoid of holes.

2. The phononic structure according to claim 1, wherein the adjacent regions have dissimilar phonon energy band structures.

3. The phononic structure according to claim 1, wherein the holes are filled with a second material.

4. The phononic structure according to claim 3, wherein the second material is selected from the group consisting of thermal insulators, polymers, glasses, ceramics, aerogels, natural materials, and epoxies.

5. The phononic structure according to claim 1, wherein distance between holes is not larger than twice a thickness of the sheet of the first material.

6. The phononic structure according to claim 1, wherein distance between holes is not larger than twice the phonon mean free path of the first material.

7. The phononic structure according to claim 1, wherein the first material is selected from the group consisting of silicon, graphene, germanium, silicon-germanium, and lead-telluride.

8. A phononic structure comprising:
   a sheet of a first material, the sheet comprising a plurality of regions, wherein adjacent regions have dissimilar phononic patterns and are configured to carry a heat flow along a longitudinal axis of the phononic structure, and each region has a length perpendicularly to the longitudinal axis of the phononic structure, the length being more than twice a phonon mean free path of the first material, wherein:
the plurality of regions comprises a first set of regions and a second set of regions, the first set of regions comprising a periodic pattern of holes in the first material,
regions in the first set of regions have a first phononic pattern,
regions in the second set of regions have a second phononic pattern dissimilar to the first phononic pattern,
the phononic structure alternates, along the longitudinal axis of the phononic structure, between a region from the first set of regions and a region from the second set of regions, and
the first set of regions comprises at least three regions and the second set of regions comprises at least three regions.

9. The phononic structure according to claim 1, wherein the phononic structure has a lower thermal conductivity than the first material.

10. The phononic structure according to claim 1, wherein the phononic structure has a lower thermal conductivity than the first material and the phononic structure has substantially the same electrical conductivity as the first material.

11. A thermoelectric device, comprising:
at least a first sheet and a second sheet of a semiconductor material, each of the first sheet and the second sheet comprising a first region and a second region adjacent the first region, wherein the first region and the second region have dissimilar phononic patterns and are configured to carry a heat flow along a longitudinal axis of the thermoelectric device;
a first electrode electrically coupled to a first side of the first sheet;
a second electrode electrically coupled to a first side of the second sheet; and
a third electrode electrically coupled to a second side of the first sheet and the second sheet,
wherein:
both the first and second regions have a length perpendicularly to the longitudinal axis of the thermoelectric device, the length being more than twice a phonon mean free path of the semiconductor material,
the first region comprises a period pattern of holes and the second region is devoid of holes, and
during operation of the thermoelectric device, the first and second sides of each sheet are adapted to exhibit different temperatures.

* * * * *